United States Patent
Grejda et al.

(10) Patent No.: US 12,078,936 B2
(45) Date of Patent: Sep. 3, 2024

(54) MAGNIFICATION ADJUSTABLE PROJECTION SYSTEM USING DEFORMABLE LENS PLATES

(71) Applicant: Corning Incorporated, Corning, NY (US)

(72) Inventors: Robert Dennis Grejda, Fairport, NY (US); Brian Monroe McMaster, Pittsford, NY (US); Paul Francis Michaloski, Rochester, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 17/897,328

(22) Filed: Aug. 29, 2022

(65) Prior Publication Data

US 2023/0077090 A1 Mar. 9, 2023

Related U.S. Application Data

(60) Provisional application No. 63/239,666, filed on Sep. 1, 2021.

(51) Int. Cl.
*G03F 7/00* (2006.01)
*G02B 3/14* (2006.01)

(52) U.S. Cl.
CPC .......... *G03F 7/70266* (2013.01); *G02B 3/14* (2013.01)

(58) Field of Classification Search
CPC ....... G02B 27/18; G02B 3/14; G03F 7/70258; G03F 7/70266; G03F 7/70308
See application file for complete search history.

(56) References Cited

U.S. PATENT DOCUMENTS

| | | |
|---|---|---|
| 5,710,619 A | 1/1998 | Jain et al. |
| 8,174,674 B2 | 5/2012 | Mulkens et al. |
| 8,218,130 B2 | 7/2012 | Van Dam Marinus |
| 8,922,750 B2 | 12/2014 | Grejda et al. |
| 10,120,176 B2 | 11/2018 | Schicketanz et al. |
| 2008/0212183 A1 | 9/2008 | Uitterdijk et al. |

(Continued)

FOREIGN PATENT DOCUMENTS

| | | |
|---|---|---|
| JP | 62-035619 A | 2/1987 |
| JP | 2006-292902 A | 10/2006 |

OTHER PUBLICATIONS

Machine translation of JP 2006-292902, Oct. 2006.*

(Continued)

*Primary Examiner* — Peter B Kim
(74) *Attorney, Agent, or Firm* — Yiqun Zhao

(57) ABSTRACT

A magnification adjustable projection system is provided that includes an imaging system having an object or image space, a first deformable lens plate located within the object or image space for contributing a first magnification power to the imaging system as a function of an amount of curvature of the first deformable lens plate, and a second deformable lens plate located within the object or image space for contributing a second magnification power to the imaging system as a function of an amount of curvature of the second deformable lens plate. The projection system also has first and second bending apparatuses that adjust the curvature of the first and second deformable lens plate through a range of curvature variation for adjusting the magnification power of the imaging system.

20 Claims, 15 Drawing Sheets

(56) References Cited

U.S. PATENT DOCUMENTS

2009/0046348 A1* 2/2009 Sahm .................. G02B 7/183
                                                    359/290
2011/0122383 A1    5/2011 Grejda et al.
2011/0292361 A1* 12/2011 Watanabe ........... G03F 7/70783
                                                    355/52

OTHER PUBLICATIONS

International Search Report and Written Opinion of the International Searching Authority; PCT/US2022/040693; dated Dec. 12, 2022; 13 pages; European Patent Office.

* cited by examiner

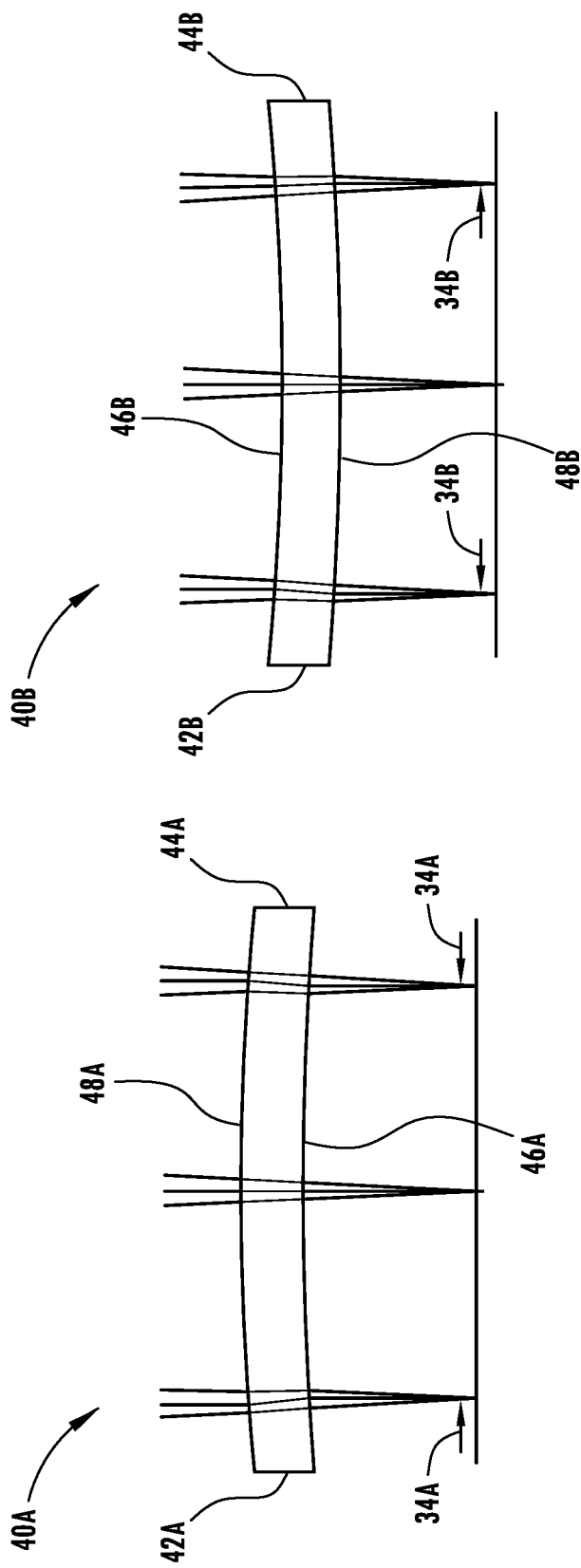

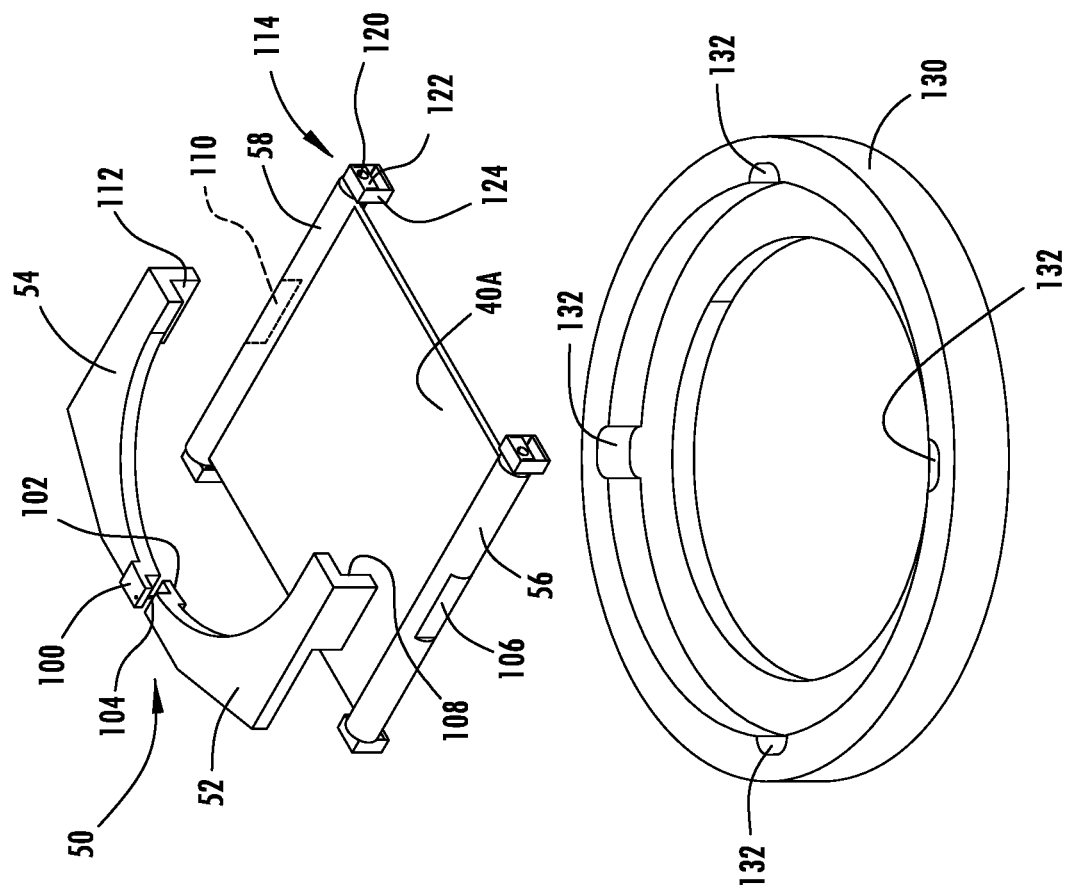
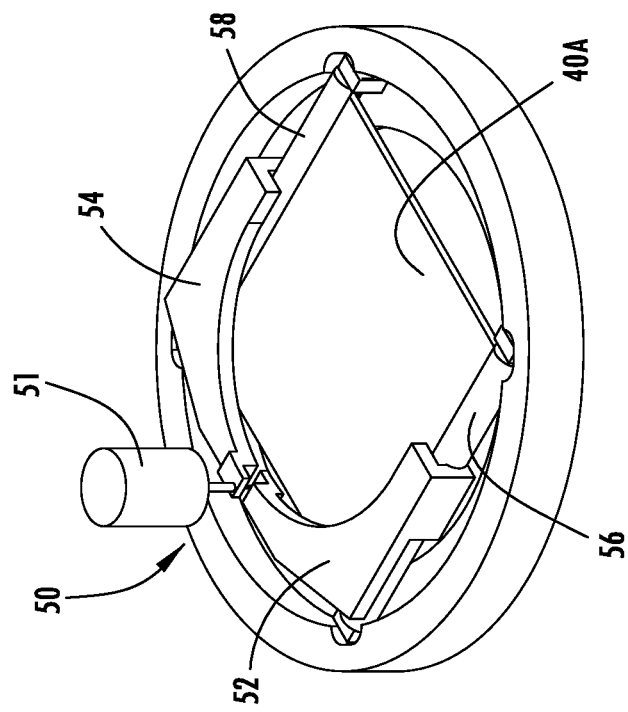
FIGURE 2D
FIGURE 2C

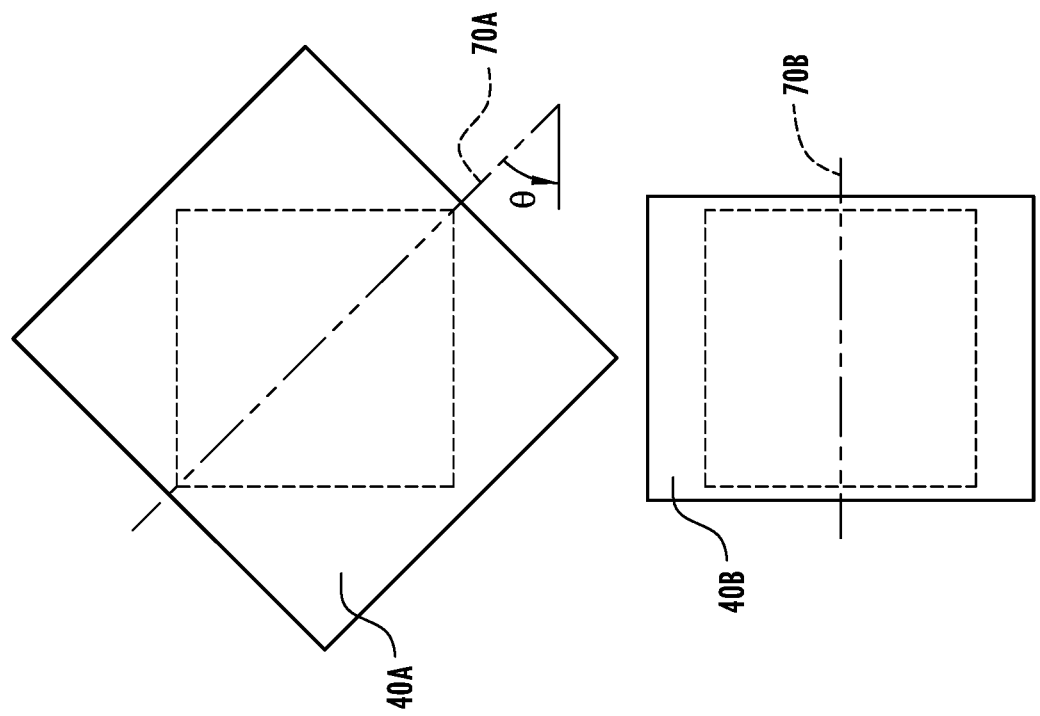
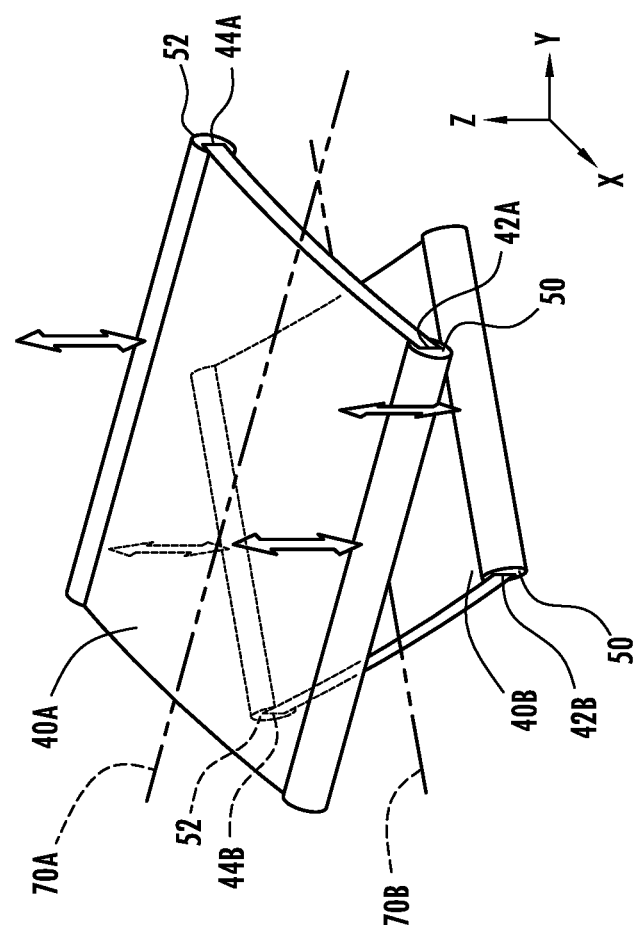
FIGURE 2F
FIGURE 2E

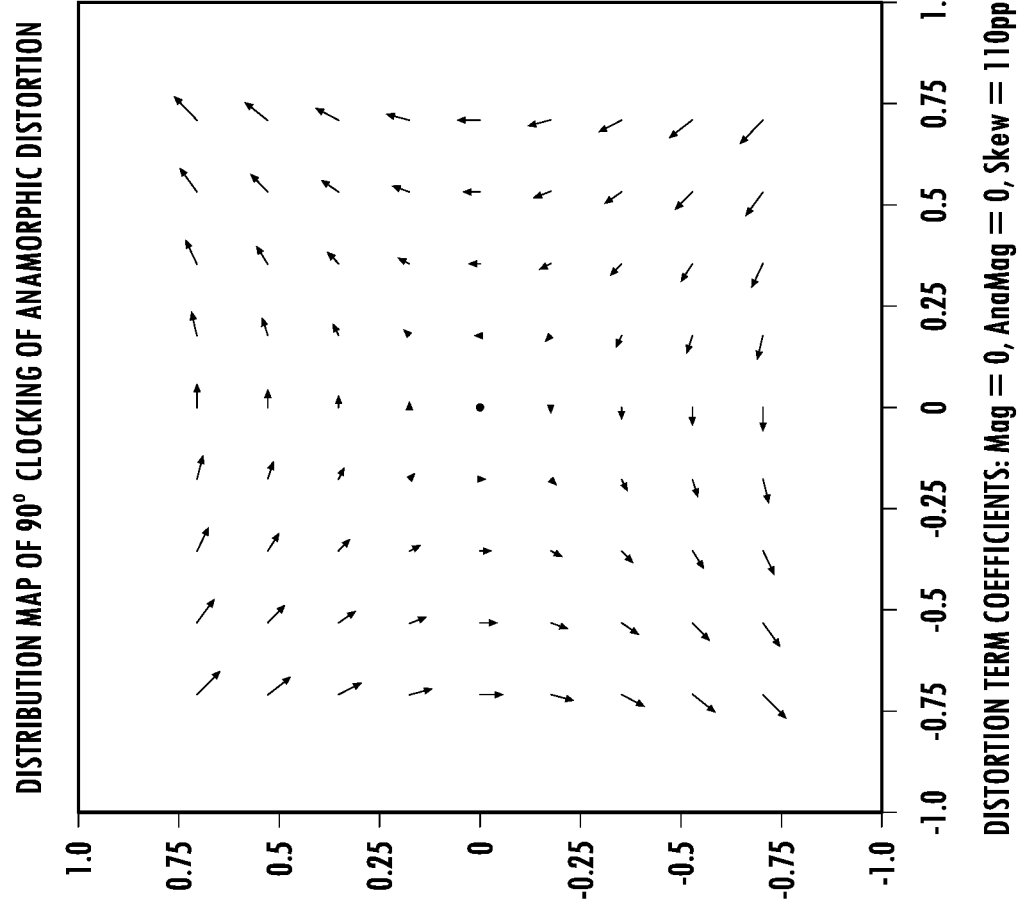

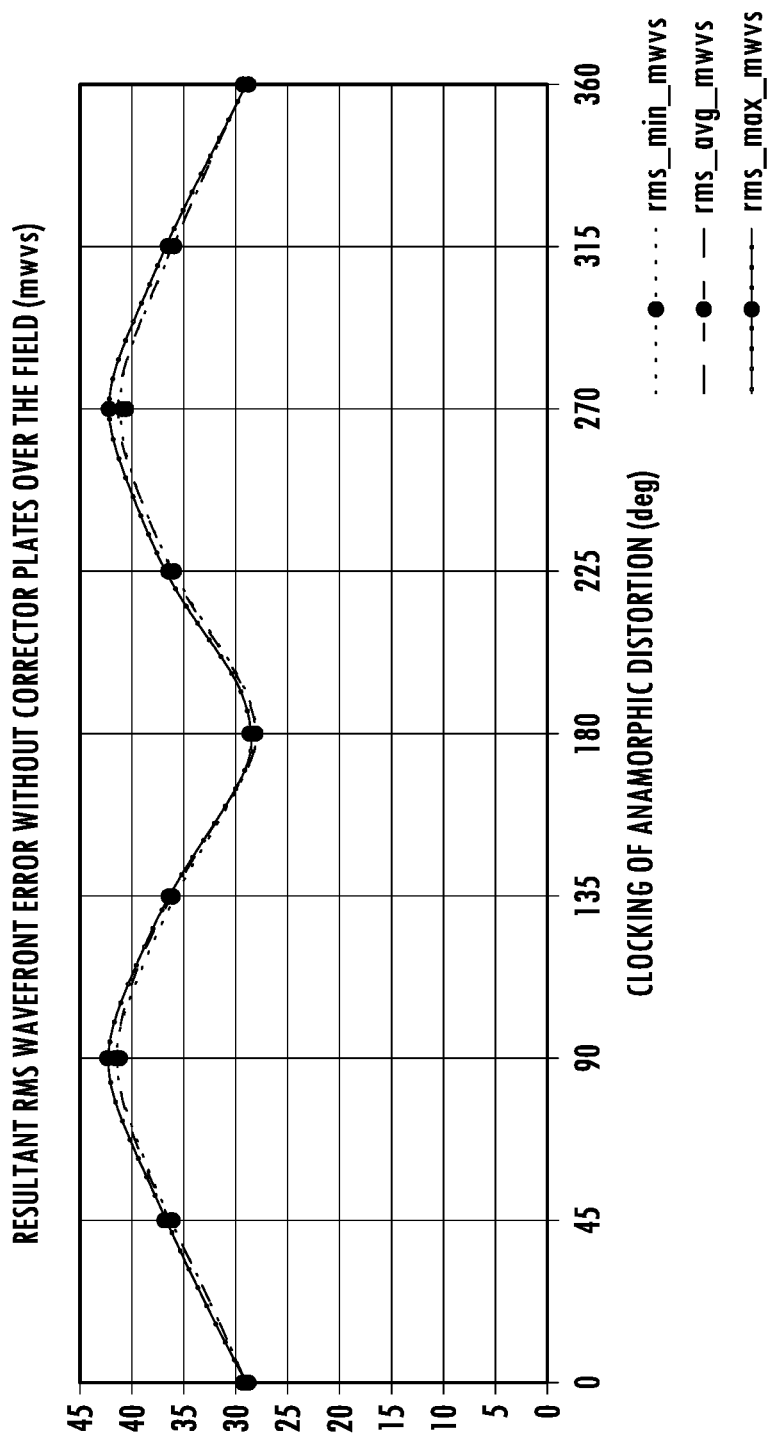

MAGNIFICATION ADJUSTABLE PROJECTION SYSTEM USING DEFORMABLE LENS PLATES

This application claims the benefit of priority under 35 U.S.C § 120 of U.S. Provisional Application Ser. No. 63/239,666 filed on Sep. 1, 2021, the content of which is relied upon and incorporated herein by reference in its entirety.

FIELD OF THE DISCLOSURE

The present disclosure generally relates to optical projection systems, and more particularly relates to an anamorphic magnification adjustable projection system for projecting patterns.

BACKGROUND OF THE DISCLOSURE

Lithographic projection systems commonly project patterns onto substrates for selectively exposing photosensitive layers at multiple stages during the manufacture of microcircuits and micro devices. Image magnification of the projected patterns is finely controlled to relate the patterns in successive exposures. Lithography requires precise alignment of the current exposed layer to a previous exposed layer on a substrate. The overlay generally has been achieved by alignment of the substrate to the image and magnification of the image by adjustments in the projection lens or mask position. It may be desirable to provide an adjustment of the anamorphic magnification in any clocking direction around the optical axis without experiencing excessive degradation of the image properties.

SUMMARY OF THE DISCLOSURE

According to one embodiment of the disclosure, a magnification adjustable projection system is provided. The magnification adjustable projection system includes an imaging system having an object or image space, a first deformable lens plate located within the object or image space for contributing a first magnification power to the imaging system as a function of an amount of curvature of the first deformable lens plate, and a second deformable lens plate located within the object or image space for contributing a second magnification power to the imaging system as a function of an amount of curvature of the second deformable lens plate. The system also includes a first bending apparatus that adjusts the curvature of the first deformable lens plate through a range of curvature variation for adjusting the first magnification power of the imaging system, and a second bending apparatus that adjusts the curvature of the second deformable lens plate through a range of curvature variation for adjusting the second magnification power of the imaging system, wherein the first deformable plate is adjustable about a first transverse axis that extends substantially normal to an optical axis of the imaging system and the second deformable lens plate is adjustable about a second transverse axis that extends substantially normal to the optical axis of the imaging system, and wherein the first and second deformable lens plates are oriented such that the first transverse axis is approximately forty-five degrees (45°) relative to the second transverse axis.

According to another embodiment of the disclosure, a magnification adjustable projection system is provided. The magnification adjustable projection system includes an imaging system having an object or image space and a projection lens assembly, a first deformable lens plate located within the object or image space for contributing a first anamorphic magnification power to the imaging system as a function of an amount of curvature of the first deformable lens plate, and a second deformable lens plate located within the object or image space for contributing a second anamorphic magnification power to the imaging system as a function of an amount of curvature of the second deformable lens plate. The system also includes a first bending apparatus that adjusts the curvature of the first deformable lens plate through a range of curvature variation for adjusting the first anamorphic magnification power of the imaging system, a second bending apparatus that adjusts the curvature of the second deformable lens plate through a range of curvature variation for adjusting the second anamorphic magnification power of the imaging system, wherein the first deformable plate is adjustable about a first transverse axis that extends substantially normal to an optical axis of the imaging system and the second deformable plate is adjustable about a second transverse axis that extends substantially normal to the optical axis of the imaging system, and wherein the first and second deformable lens plates are oriented such that the first transverse axis is approximately forty-five degrees (45°) relative to the second transverse axis, and a first rotating corrector plate located substantially in a pupil of the projection lens assembly and parallel to a second rotating corrector plate, wherein the first and second rotating corrector plates each have a shaped surface and are movable relative to each other to correct for astigmatism.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments.

BRIEF DESCRIPTION OF THE DRAWINGS

FIG. 2A is a side view of a first deformable lens plate shown bent in a first cylindrical shape;

FIG. 2B is a side view of a second deformable lens plate shown bent in a second cylindrical shape;

FIG. 2C is an upper perspective view of a deformable lens plate and an apparatus for bending the deformable lens plate;

FIG. 2D is an exploded view of the apparatus for bending the deformable lens plate of FIG. 2C;

FIG. 2E is a perspective view of the two overlapping deformable plates each arranged for bending in different directions at forty-five degrees (45°) relative to each other;

FIG. 2F is a top exploded view of the first and second deformable bending plates oriented at a rotated angle of forty-five degrees (45°);

FIG. 4B is a field distortion map showing 90° clocking of anamorphic magnification distortion rotated as skew in the image space;

FIG. 10A is a graph illustrating the resultant RMS wavefront error without the rotating corrector plates over the field throughout the anamorphic clocking.

DETAILED DESCRIPTION

Figure 1:
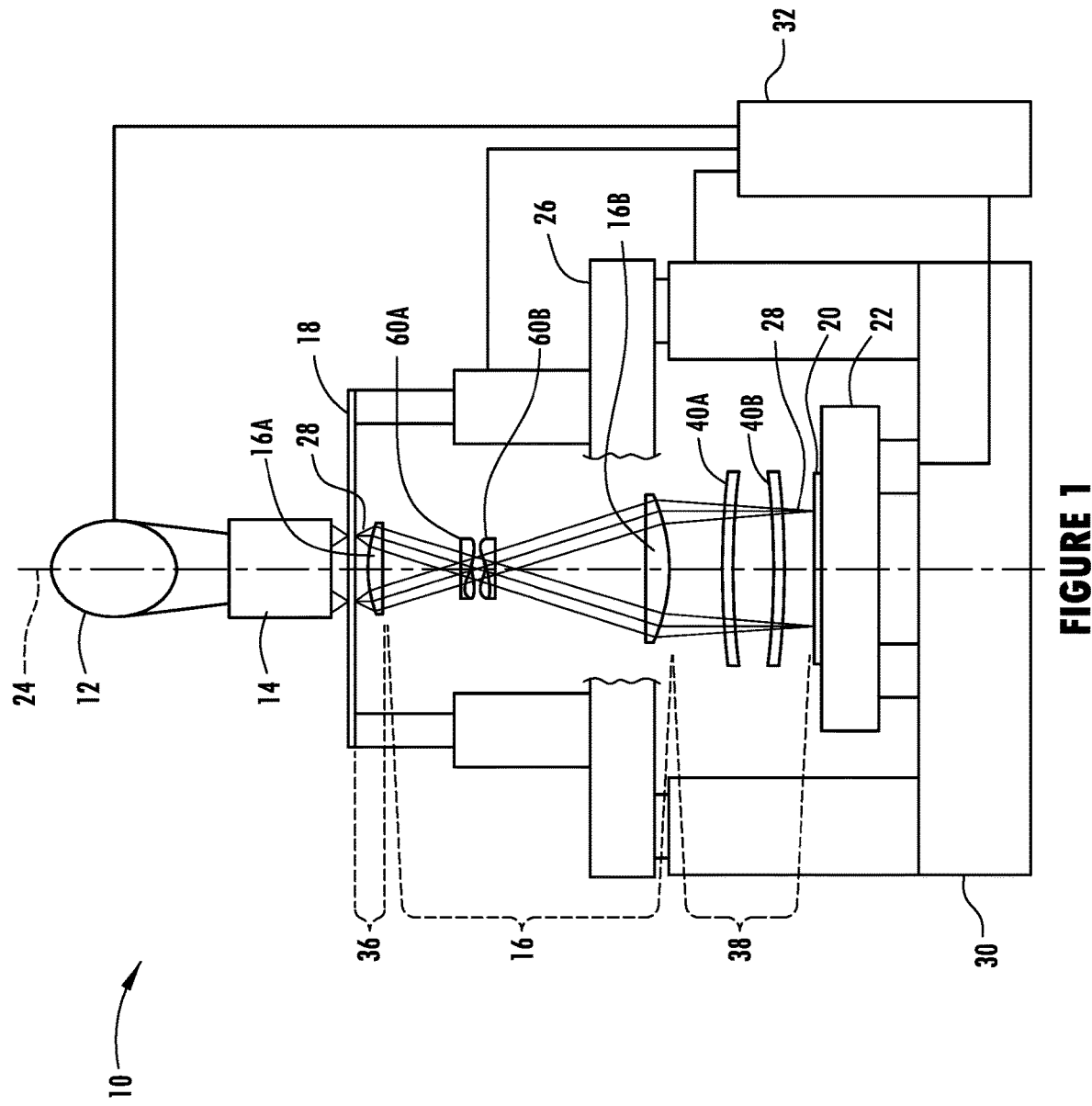
FIG. 1 is a diagram of a lithographic projection system with a pair of the deformable plates within telecentric image space for providing magnification adjustment.

Reference will now be made in detail to the present preferred embodiments, examples of which are illustrated in the accompanying drawings. Whenever possible, the same reference numerals will be used throughout the drawings to refer to the same or like parts.

The following detailed description represents embodiments that are intended to provide an overview or framework for understanding the nature and character of the claims. The accompanied drawings are included to provide a further understanding of the claims and constitute a part of the specification. The drawings illustrate various embodiments, and together with the descriptions serve to explain the principles and operations of these embodiments as claimed.

Referring to FIG. 1, a microlithographic projection system (tool) 10 is illustrated, as an example of a projection system which includes a light source 12, an illuminator 14, and a projection lens assembly 16 for projecting an image of a reticle 18 onto a substrate 20. A horizontal X-Y-axis stage 22, which is translatable in two orthogonal directions normal to a common optical axis 24 of the illuminator 14 and the projection lens assembly 16, provides for relatively moving the substrate 20 with respect to the projection lens assembly 16 for exposing successive areas of the substrate 20. A vertical Z-axis stage 26 provides for relatively translating the projection lens assembly 16 with respect to the substrate 20 along the optical axis 24 to provide for appropriately focusing the image of the reticle 18 onto the substrate 20.

The light source 12 emits radiation in the form of a beam of light 28 appropriate for developing the photosensitive substrate 20. A variety of known devices can be used for the light source 12 including a lamp source, such as a high-pressure mercury arc lamp targeting certain spectral lines, or a laser source, such as an excimer laser, particularly for operating within the ultraviolet spectrum.

The illuminator 14 provides for shaping and spatially distributing the light beam 28 and targeting angular and spatial irradiance profiles set for both the pupil and image plane of the projection lens assembly, the latter coinciding with the substrate 20. Although not shown in detail in FIG. 1, typical illuminators for microlithographic operations include a profiler for collecting and shaping the beam 28, a uniformizer (e.g., a kaleidoscope or fly's eye array) for integrating the light into a uniform irradiance field, and a relay lens for relaying an image of the output of the uniformizer to the reticle 18, where an image plane of the illuminator 14 coincides with an object plane of the projection lens assembly 16.

The projection lens assembly 16 is shown in a simplified view having a first lens element 16A receiving the beam of light from the illuminator 14 and a second lens element 16B outputting the light to the first and second deformable lens plates 40A and 40B. The projection lens assembly 16 may include more than two lens elements such as twelve to thirty lens elements, for example. The first lens element 16A has a posterior surface on the input side and the second lens element 16B has a posterior surface on the light output side. The first lens element 16A is spaced from the second lens element 16B so as to create a desired size beam of light entering the first and second deformable lens plates 40A and 40B. Disposed between the first and second lens elements 16A and 16B are first and second corrector lens plates 60A and 60B which is in the pupil region of the projection. The projection lens assembly 16, which may have an entrance numerical aperture (NA) larger than an exit numerical aperture of the illuminator 14 for providing partial coherent imaging, projects an image of the reticle 18 onto the substrate 20. That is, a pupil (not shown) of the projection lens assembly 16, which is typically conjugate to a pupil (also not shown) in the illuminator 14, may be underfilled by the image of the illuminator pupil but is sized to collect angularly divergent light from illuminated features of the reticle 18 to produce a high resolution image of the reticle 18 on the substrate 20. The projected image of the reticle 18 can be enlarged or reduced as required by shifting height of the reticle or one or more lens elements within the projection lens assembly. Reduction or enlargement is a rotationally symmetrical magnification change which may be needed for achieving full clocking range of anamorphic magnification. The projection lens assembly 16 can include reflective or diffractive elements as well as refractive elements or combinations of such elements, such as in catadioptric optics.

The reticle 18, also referred to as a "mask," includes one or more patterns intended for projection onto the substrate 20 and can be sized within or beyond the field captured by the projector lens assembly 16. Reticles with larger patterns can be relatively translated with respect to the projection lens assembly 16 to expose different parts of the reticle patterns in succession.

The photosensitive substrate 20 is shown generally in the form of a flat plate, such as a semiconductor wafer or glass panel treated with a photoresist to react to exposures of light. Often, the entire substrate 20 cannot be imaged at once, so the horizontal X-Y-axis translational stage 22 on a base 30 provides for translating the substrate 20 through a range of positions for collectively illuminating a desired working area of the substrate 20. The projection lens assembly 16 is supported on a stage 26 above the base 30. The substrate 20 may be adjusted vertically to adjust the image distance of the projection lens assembly 16 from the substrate 20 along the optical axis 24 to maintain focus. A controller 32 coordinates relative motions among the projection lens assembly 16, the reticle 18, and the substrate 20 as well as the exposure of the projection system 10.

First and second deformable lens plates 40A and 40B are shown located below the projection lens assembly 16 within a telecentric image space 38 of the projection lens assembly 16. The first and second deformable lens plates 40A and 40B are independently bendable about respective cylindrical transverse axes and may be bent about the cylindrical transverse axis in either direction into a convex or concave shape. Although shown in telecentric image space 38 adjacent to the substrate 20, the first and second deformable lens plates 40A and 40B could also be located in telecentric object space 36. The choice can be made largely on the basis of space and access considerations. In either or both locations, the first and second deformable lens plates 40A and 40B can control magnification in a lithographic projection system that is telecentric in both image and object space.

FIGS. 2A and 2B shows the first and second deformable lens plates 40A and 40B in a deformed condition bent into a partial cylindrical shape having a cylindrical shaped surface contour bent about respective first and second cylindrical transverse axes 70A and 70B shown in FIGS. 2E and 2F. The first deformable lens plate 40A is shown in FIG. 2A having a posterior surface 48A on top and an anterior surface 46A on the bottom. A first end 42A of lens plate 40A is opposite a second end 44A of the lens plate 40, and the first and second ends 42A and 44A have edges that are configured to be connected to a pair of rotatable rods. A bending load is generated by the pair of rotatable rods acting at the first and second ends 42A and 44A of the deformable plate 40A. The deformation in the form of bending places the anterior surface 46A of the first deformable lens plate 40A in compression and the posterior surface 48A of the first deformable lens plate 40A in tension which results in the shape of a cylindrical surface bent about the cylindrical transverse axis 70A extending midway between the first and second ends 42A and 44A and parallel to the edges of the first and second ends 42A and 44A.

FIG. 2B shows the second deformable lens plate 40B having a posterior surface 48B on the bottom side and an anterior surface 46B on the top side. A first end 42B of lens plate 40B is opposite a second end 44B of lens plate 40B and each end has an edge configured to be connected to a rotatable rod. A bending load is generated by the rotatable rods acting at the first and second ends 42B and 44B of the second deformable lens plate 40B to deform the plate by bending the plate. The deformation places the anterior surface 46B of the deformable plate 40B in compression and the posterior surface 48B of the deformable plate 40B in tension which results in the shape of a cylindrical surface bent about the cylindrical transverse axis 70B extending midway between the first and second ends 42B and 44B and parallel to the edges of the first and second ends 42B and 44B.

The first deformable lens plate 40A is deformable into a cylindrical shape such that the beam of light 28 entering the posterior surface 48A and passing through the first deformable lens plate 40A is reduced in size as shown by arrows 34A in FIG. 2A due to the cylindrical curvature of the first deformable lens plate 40A. The second deformable lens plate 40B is deformed into a cylindrical shape such that the beam of light 28 passing therethrough and exiting the posterior surface 48B is enlarged as shown by arrows 34B in FIG. 2B due to the cylindrical curvature of the second deformable lens plate 40B.

In the unloaded condition, each of the first and second deformable lens plates 40A and 40B may be a thin plane-parallel plate that is rectangular in shape with the anterior and posterior surfaces 46 and 48 both flat and parallel. The rectangular deformable lens plates are each bendable along an axis of a cylindrical surface extending parallel to the first and second ends to provide a cylindrical distribution. Each of the first and second deformable lens plates 40A and 40B may be made of optical glass in either an amorphous or crystalline form to provide for the transmission of light without generating unnecessary wavefront aberrations or departures from uniformity. Each of first and second deformable lens plates 40A and 40B may also be thin enough in relation to its length between ends 42A and 42B and 44A and 44B to effect the desired bending. For example, a deformable lens plate having an overall length of 90 millimeters is preferably 5 millimeters or less in thickness, according to one embodiment.

The projection system includes a first bending apparatus 50 for bending the first deformable bending plate 40A and a second bending apparatus 50 for bending the second deformable plate 40B. Referring to FIGS. 2C and 2D, the first deformable lens plate 40A is shown assembled onto the first bending apparatus 50 having a linear actuator 51 for bending the first deformable lens plate 40A into either a concave or convex cylindrical shape having a cylindrical surface. While the first bending apparatus 50 is shown in connection with bending to deform the first deformable lens plate 40A, it should be appreciated that the same or similar bending apparatus 50 is likewise employed to bend the second deformable lens plate 40B. In this example, the deformable lens plate 40A is connected on first and second ends 42A and 44A to respective first and second rotatable rods 56 and 58. The edges at the first and second ends 42A and 44A of deformable lens plate 40A may extend within slots within each of the respective rods 56 and 58. First and second rotatable rods 56 and 58 are mounted within a housing 130 having two pairs of receiver slots 132 for receiving and holding the respective pair of rotatable rods 56 and 58 in place within housing 130. First rotatable rod 56 is coupled to a first arm 52 that has a first engagement surface 104 at one end. The opposite end engages a flattened portion 106 of rod 56 via surface 108. As such, rotation of first arm 52 causes rotation of first rotatable rod 56. Similarly, the second rotatable rod 58 is connected to a second arm 54 which engages a flat surface 110 on second rotatable rod 58 via surface 112. Second arm 54 has a second engagement surface 100 on one end that is actuatable by a linear actuator 51. Rotation of the second arm 54 causes rotation of second rotatable rod 58. The linear actuator 51 may include a motor, such as a rotary hollow-core motor, a piezoelectric, a lead screw, a voice coil, a pneumatic actuator, or other actuation device. The linear actuator 51 engages engagement surface 100 which, in turn, is connected to engagement surface 102 via a flexure member 104. The flexure member may be configured as a linear member that is rigid in the axial direction and flexes in the lateral direction to allow the first and second engagement surfaces 100 and 102 move laterally relative to one another while allowing upward and downward movement in sync. Linear movement of the linear actuator downward or upward causes first and second arms 52 and 54 to rotate in sync which likewise causes first and second rods 56 and 58 to rotate about their respective cylindrical axes, thereby bending the first deformable lens plate 40A along a cylindrical transverse axis in the shape of a cylindrical surface. As the first deformable lens plate 40A bends, the first and second rotatable rods 56 and 58 are able to move laterally toward and away from each other to accommodate changes in the lateral distance between the ends due to the bending. The lateral movement of the first and second rotatable rods 56 and 58 is achieved by employing flexure mounts 114 on each terminal end of first and second rotatable rods 56 and 58. The flexure mounts 114 include a connector bearing 120 positioned within a deformable member 122 that moves laterally to accommodate changes in distance between the rods 56 and 58 that occur as the first deformable lens plate 40A bends into various cylindrical shapes having various bending radii. It should be appreciated that other bending mechanisms may be employed as the first and second bending apparatuses to bend the first and second deformable lens plates 40A and 40B, according to other embodiments.

The first deformable lens plate 40A is located within the object or image space for contributing a first amount of anamorphic magnification power to the imaging system as a function of an amount of cylindrical curvature of the first deformable lens plate 40A. The second deformable lens plate 40B is also located within the object or image space for contributing a second amount of anamorphic magnification power to the imaging system as a function of an amount of cylindrical curvature of the second deformable lens plate 40B. The first bending apparatus 50 adjusts the curvature of the first deformable lens plate 40A through a range of curvature variation for adjusting the magnification of the imaging system. The second bending apparatus 50 adjusts the curvature of the second deformable lens plate 40B through a range of curvature variation for adjusting a magnification of the imaging system.

As seen in FIGS. 2E and 2F, the first deformable lens plate 40A is adjustable about a first cylindrical transverse axis 70A that extends substantially normal to the optical axis 24 of the imaging system. The second deformable lens plate 40B is adjustable about a second cylindrical transverse axis 70B that extends substantially normal to the optical axis 24 of the imaging system. The first and second deformable lens plates 40A and 40B are oriented at an angle θ such that the first cylindrical transverse axis 70A is approximately forty-five degrees (45°) relative to the second cylindrical transverse axis 70B. As seen in FIG. 2F, the first deformable lens plate 40A is larger in size than the second deformable lens plate 40B due to the 45 degree relative rotation in order to overlap and cover the entire same imaging field.

It should be appreciated that less bending is required for lens plates of increased thickness to achieve the same range of magnification adjustment. However, the thicker lens plates, particularly those substantially greater than 5.0 mm in thickness, may be more difficult to bend and can produce other unintended effects.

A relatively pure magnification change accompanying a cylindrical distortion of the lens plates can be derived by considering how a tilted plate laterally deviates the telecentric rays. The deviation is a function of the tilt, thickness and refractive index of the lens plate. The telecentric rays are the rays that pass through the center of the aperture stop of each imaging lens and are parallel in the telecentric image or object space. A lens plate bent in a cylindrical shape can be considered on a localized level as a plurality of individually tilted plates whose tilt increases by a sign function with distance from the optical axis, and the relationship between ray deviation and distance from the optical axis is highly linear for small bends. This linearity means that the deviations are proportional to the distance from the optical axis and the deviations have predominantly changed only the magnification of the image in the direction of the bend and not the distortion.

As an example, if a lens plate is bent cylindrically, such that the maximum angle of incidence is one degree at the edge of the telecentric rays, then the distortion (i.e., departure from a linear deviation) is approximately 1:15,000 of the magnification. If the maximum angle of incidence is two degrees (2°) at the edge of the telecentric rays, then the ratio distortion to magnification changes by a factor of 4 to 1:3,750. Thus, the magnification effects of a bent lens plate in telecentric image space may dominate any distortion effects, particularly at small amounts of lens plate curvature.

The first and second deformable lens plates 40A and 40B are oriented at angle θ such that the first and second cylindrical transverse axes 70A and 70B are forty-five degrees (45°) relative to one another and both axes 70A and 70B extend normal to the optical axis 24. Together, the first and second deformable lens plates 40A and 40B can produce a range of anamorphic magnification adjustments by relatively adjusting the relative magnitude of adjustments contributed by each of the first and second deformable lens plates 40A and 40B or by adjusting the relative angular positions of their cylindrical transverse axes 70A and 70B. A uniform magnification adjustment (i.e., a radially symmetric magnification adjustment) at the substrate 20 can be provided by making equal magnification adjustments with the first and second deformable lens plates 40A and 40B about their cylindrical transverse axes 70A and 70B. One of the two cylindrical transverse axes 70A or 70B over which magnification control is provided corresponds to an intended direction for stepping or scanning the projection lens assembly 16 across the substrate 20.

The first and second deformable lens plates 40A and 40B may have no optical power, so as to maintain telecentricity across the field, and to avoid other aberrations. Spherical and axial color aberrations may occur when focusing through a glass plate. The projection lens assembly 16 can be designed to have the opposite spherical and axial color of that induced by the first and second deformable lens plates 40A and 40B so that the aberrations will cancel. Astigmatism may be produced when imaging through a cylindrical glass lens plate or air plate existing between two cylindrical glass lens plates. This astigmatism may change the orientation as the first and second deformable lens plates 40A and 40B are actuated for different magnitudes and clockings of anamorphic magnification, such that dynamic correction may be needed. The astigmatism produced may be largely uniform over the field.

Figure 3B:
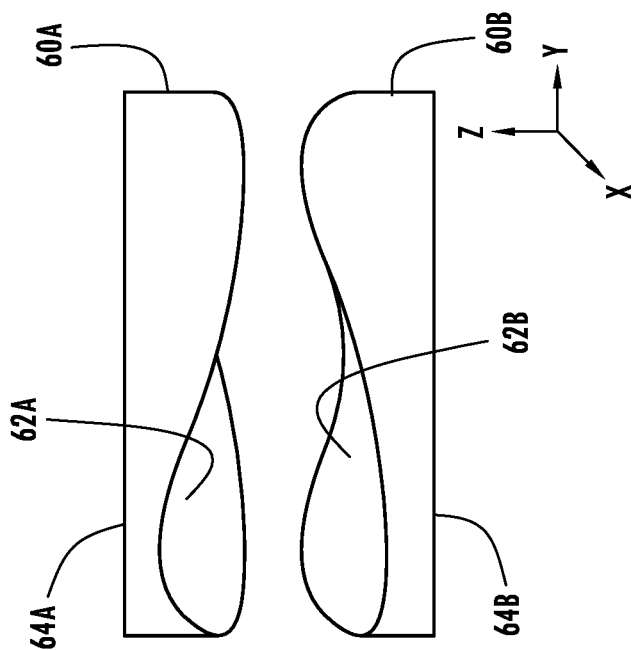
FIG. 3B is a side view of the pair of rotating corrector plates shown in FIG. 3A.
Figure 3A:
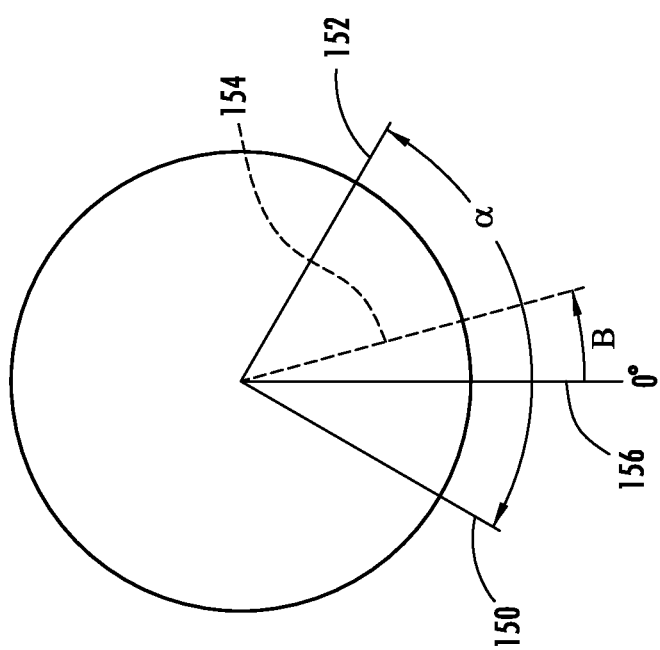
FIG. 3A is a top view of a pair of rotating corrector plates for use in the projection system, according to one example.

In order to correct for the astigmatism, the projection lens assembly 16 includes first and second rotating corrector plates 60A and 60B which are shown in more detail in FIGS. 3A and 3B. The first and second rotating corrector plates 60A and 60B are located in the pupil space of the projection lens assembly 16 between lenses 16A and 16B and can generate the opposite astigmatism at any clocking of anamorphic distortion over the image field that is created by the use of the first and second deformable lens plates 40A and 40B. The interfacing surfaces of the first and second rotating corrector plates 60A and 60B have respective shaped surfaces 62A and 62B that depart from a planar surface. The opposing surfaces 64A and 64B are shown as generally planar. The shaped surfaces 62A and 62B may each be in shape of a sag which is a shape of the astigmatism that is created. The sag shape may be a hyperbolic paraboloid or a saddle shape as shown in FIG. 3B. The shape may be the fifth Fringe Zernike term that is in cylindrical coordinates defined as $Z_5 R^2 \cos(2\theta)$, where R is the distance from the optical axis and θ is the clocking around the perimeter of the round corrector plates 60A and 60B. The $Z_5$ is the Zernike coefficient that is a distance of half of the peak-to-valley (P-V) of the shape. The Sixth Zernike uses sine instead of cosine, so it is the same shape but rotated forty-five degrees (45°). The summation of both shapes with a set of these two coefficients can generate astigmatism of any magnitude and clocking. This summation is analagous to the use of zero degree (0°) and forty-five degrees (45°) cylinder pairs to generate anamorphic astigmatism of varying magnitude and clocking. The two rotating corrector plates 60A and 60B have the saddle shapes rotated ninety degrees (90°) from each other, so that when they have the same clocking, they cancel and no astigmatism is generated.

The first and second rotating corrector plates 60A and 60B are rotated relative to one another as seen in FIG. 3A. Line 150 represent the lower second rotating corrector plate 60B position and line 152 represents the upper first rotating corrector plate 60A position with the same surfaces 62A and 62B. The first and second corrector plates 60A and 60B are shown rotated by angle α which is ninety degrees (90°) in this example. Line 154 represent a line for indicating an average rotation B relative to line 156 which is at zero degree (0°). The rotation may be achieved by rotating either the first or second rotating corrector plate with the other corrector plate fixed or rotating both corrector plates, with one or more actuators. As the difference in clocking increases, the magnitude of the generated astigmatism may increase. The clocking of that astigmatism is set by the average of the two clockings. The amount of correction depends on the anamorphic magnification, the distance from the deformable lens plates to the image plane, and the numerical aperture of the imaging system. This correction method allows the projection system 10 to stay on a straight line optical axis (on-axis). Another alternative method may be to introduce mirrors and produce an off-axis system with a MEMS deformable mirror.

The following is an example of a projection system that uses a numerical aperture of 0.065, an image field of 250×250 mm, and a spectral bandwidth from 363-370 nm (i-line of Hg). The terms magnification and anamorphic magnification are used to describe the relationship of image point placements over a field relative to the object. The calculations shown in Table 1 below use a 9×9 array of field points to create a field that is then fitted to 3 distortion terms multiplied by coefficients: magnification (Mag), anamorphic magnification (AnaMag) and Skew. Anything residual to this fitting is considered residual distortion. The Mag distortion term is the change in magnification from the system fundamental magnification. The Δx and Δy are the image displacement from the nominal positive of the image point based on the fundamental magnification of the system, and x and y are the distance to that nominal point on the image plane from the optical axis.

TABLE 1

| Distortion Term Name | Equation |
|---|---|
| Magnification | Δx = x * Mag |
| | Δy = y * Mag |
| Anamorphic Magnification | Δx = x * AnaMag |
| | Δy = -y * AnaMag |
| Skew | Δx = y * Skew |
| | Δy = x * Skew |

Figure 4A:
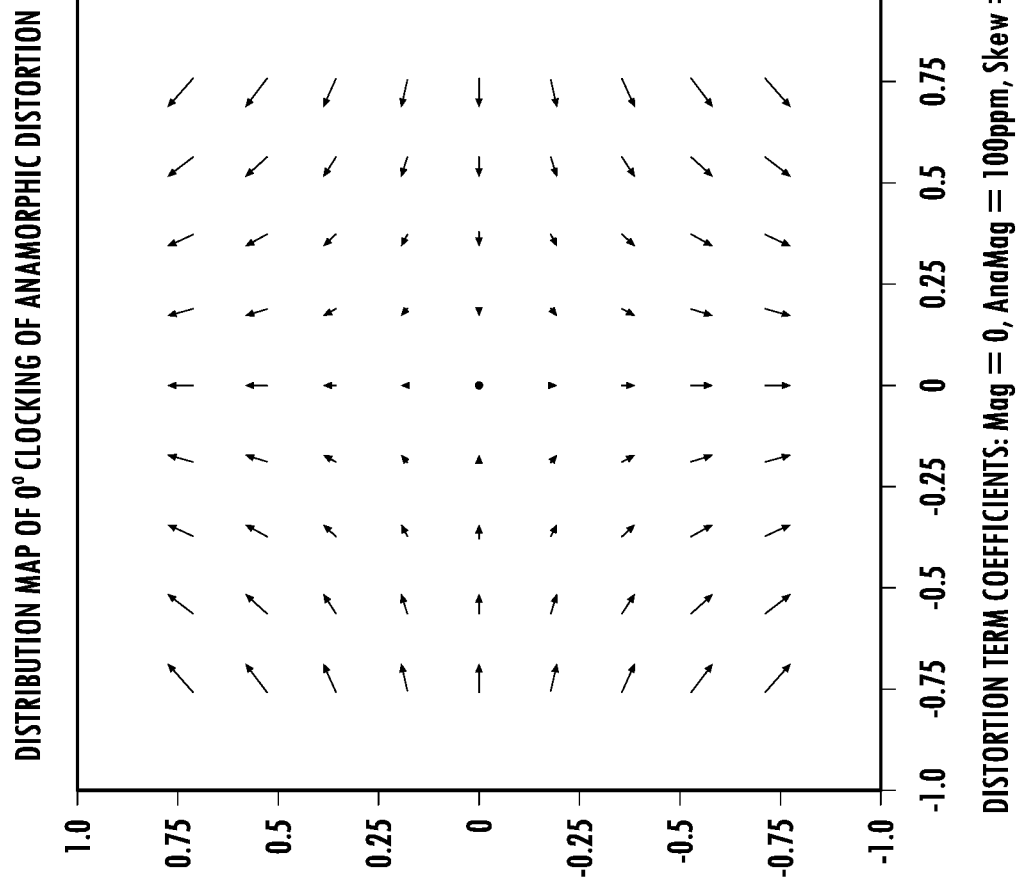
FIG. 4A is a field distortion map showing 0° clocking of anamorphic magnification distortion in the image space.

Skew is anamorphic magnification rotated which is stretching the corners of the field, while AnaMag stretches the flats. FIGS. 4A and 4B show a field distortion map of both AnaMag and Skew. The arrows are image point displacements in the field. In FIG. 4A, the field is distorted to stretch the image vertically up and down. In FIG. 4B, the field is distorted to stretch the image diagonally toward two opposing corners. The sum of the AnaMag term and Skew terms can describe all 360° anamorphic clockings. The corners might be 45° from the flats, but note that each vector in the two maps has rotated 90° and the clocking of the anamorphic magnification is 0° and 90°. The field distortion maps are independent over 360° of clocking. The root sum squared (RSS) of the coefficients gives the magnitude of the anamorphic astigmatism. The coefficients are relative to the size of the field in parts per million (ppm). According to one example, an adjustment of at least 100 ppm of anamorphic magnification may be achieved, which is the direction of max expansion is 100 ppm, and the perpendicular to that direction is contracted at -100 ppm. There is 200 ppm difference between the orthogonal directions, but is considered 100 ppm of anamorphic mag.

Table 2 below shows one example of the radii needed in the deformable lens plate to meet 100 pm anamorphic mag over the 250×250 mm field. The thicker the lens plate, the less bending is needed. The thicker the lens plate, the stiffer it is and more force is needed to bend the lens plate. The sag numbers are relative to a 400 mm long forty-five degree (45°) plate to cover the corners of the field. The zero degree (0°) requires less sag, but the same radius to achieve the magnitude of anamorphic mag.

TABLE 2

| | 5 mm | 10 mm | 20 mm |
|---|---|---|---|
| plate thickness (mm) | 5 | 10 | 20 |
| aspect 400/CT * | 80 | 40 | 20 |
| ±sag over 400 mm (mm) ** | 2.5 | 1.25 | 0.625 |
| min cylinder radius (mm) | 8001 | 16001 | 32000 |

Figure 5:
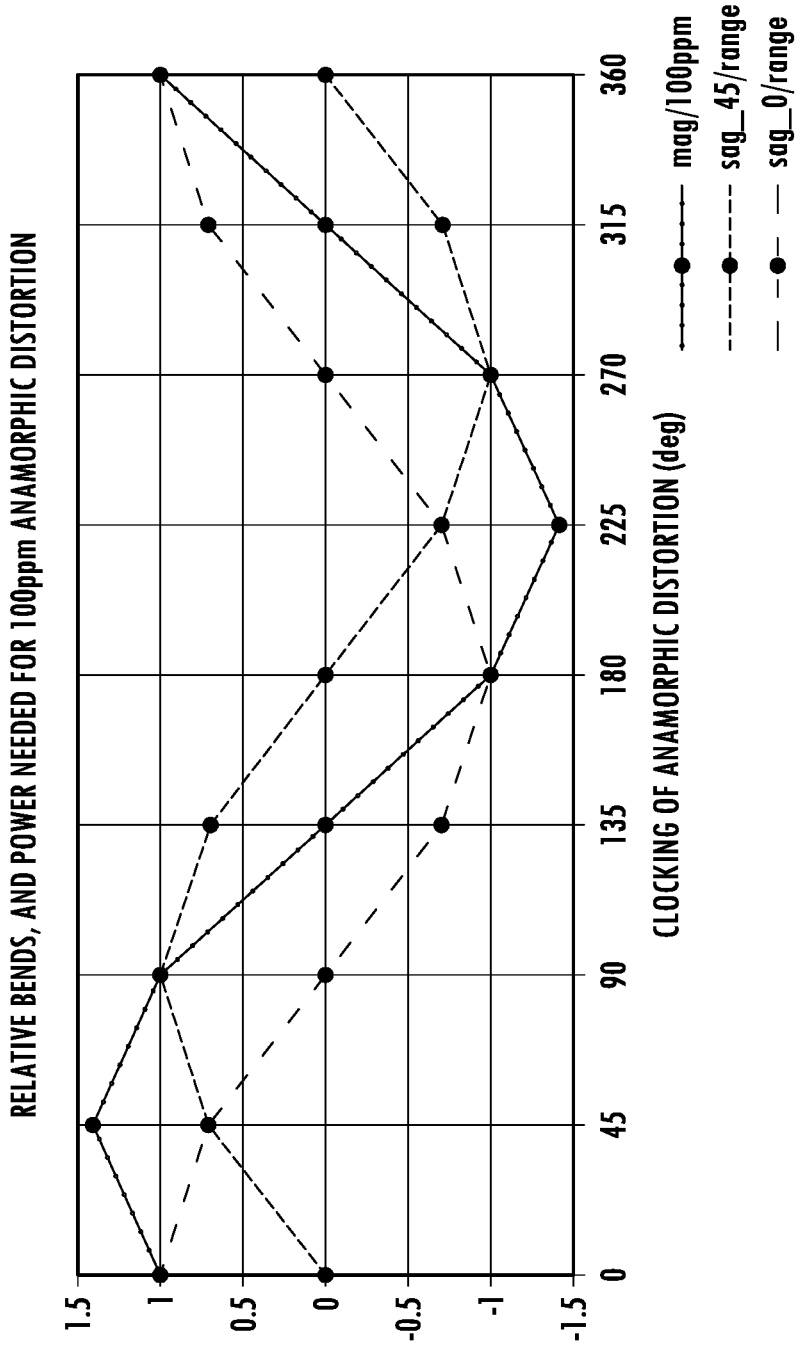
FIG. 5 is a graph illustrating the relative bending and power needed for 100 ppm anamorphic distortion throughout the anamorphic clocking.
Figure 6:
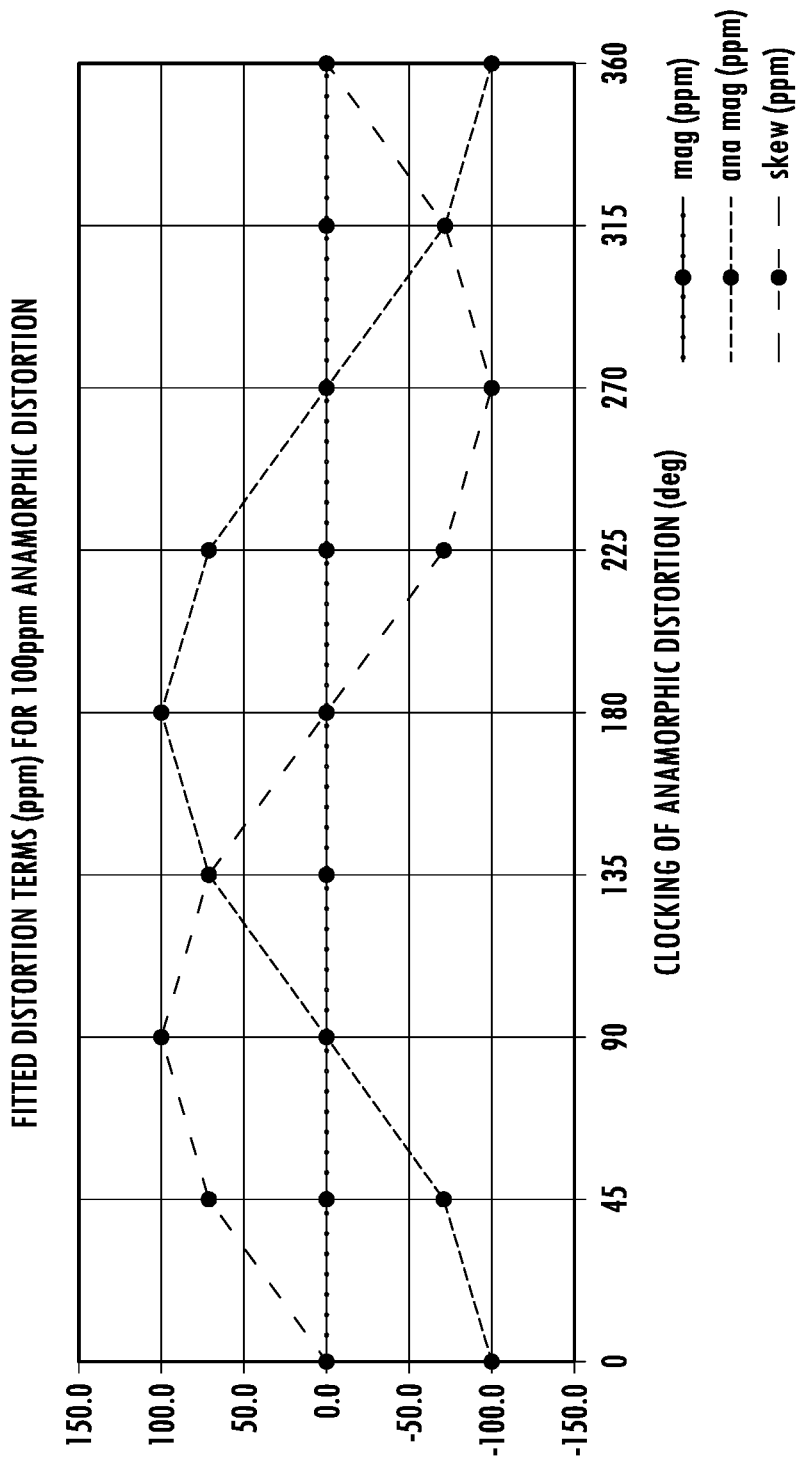
FIG. 6 is a graph illustrating fitted distortion terms for 100 ppm anamorphic distortion throughout the anamorphic clocking.

* 400 mm is needed for the 45° rotated cylinder only
** sag needed to get ±100 ppm range FIG. 5 shows the bending motions needed to obtain the anamorphic mag in all clockings as shown in FIG. 6. The RSS of the Skew and AnaMag coefficients give the magnitude of the anamorphic magnification. To obtain an anamorphic mag of 100 pm at all clockings with no mag residual, the mag needs to adjust $\pm\sqrt{2}\times100$ ppm. This mag adjust can be accomplished by shifting elements in the projection lens axially, or shifting the mask axially. The zero relative adjustment of FIG. 6 is with the plates flat, where there is no anamorphic contribution. If less than 100 ppm of anamorphic mag is desired, then the sinusoidal curves in FIG. 5 would decrease in amplitude.

In telecentric imaging, there may be spherical and axial color aberration introduced from plates in the imaging space that is easily corrected in the projection lens. The max vector produced in the field for the resultant fits in FIG. 6 is 17.7 um. The residual distortion from these fits are less than 1 nm.

Figure 7:
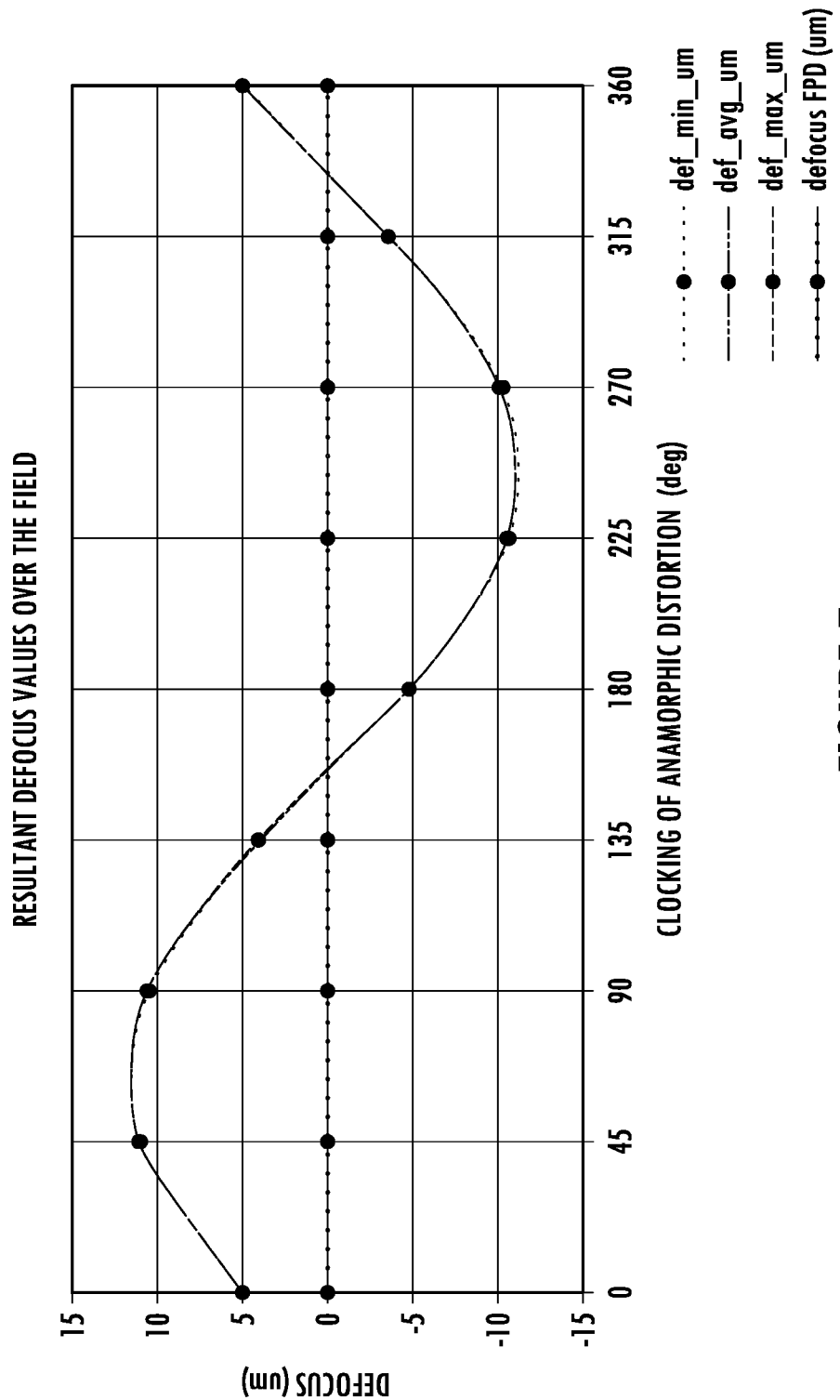
FIG. 7 is a graph illustrating resultant defocus of the image over the field throughout the anamorphic clocking.

The min, max and average values of FIG. 7 are for the distribution of defocus values over the whole field. For each setting of anamorphic mag, the projection system 10 may adjust the height of the wafer to best focus. This is a correction useful in precise lithography systems. What cannot be corrected is the variation of focus over the field, which is the focal plane deviation which is defined here as the max minus min focus. The residual is less than 1 nm for a system with a quarter wave depth of focus of ±44 um, and so is insignificant.

Figure 8A:
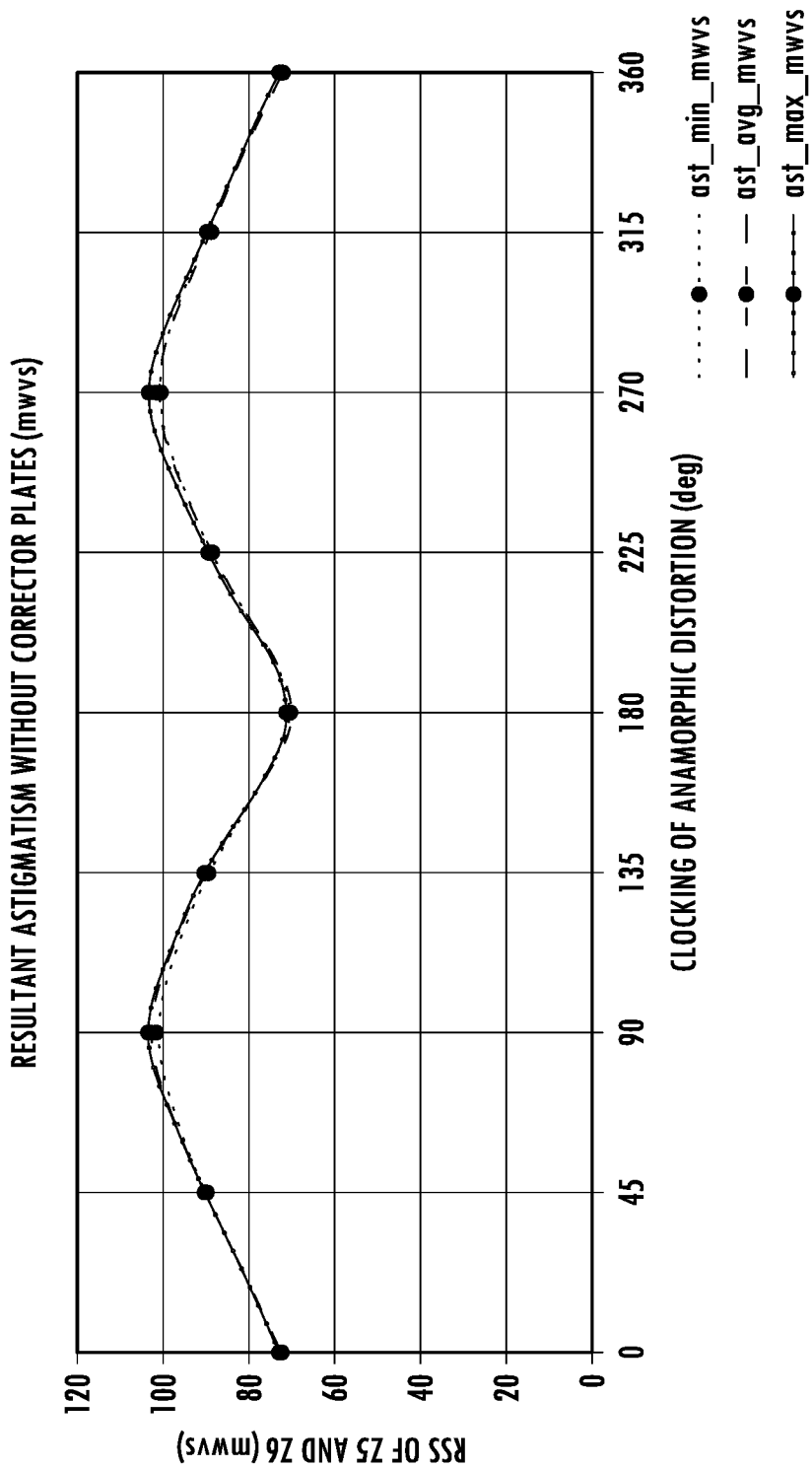
FIG. 8A is a graph illustrating resultant astigmatism without the rotating corrector plates throughout the anamorphic clocking.
Figure 8B:
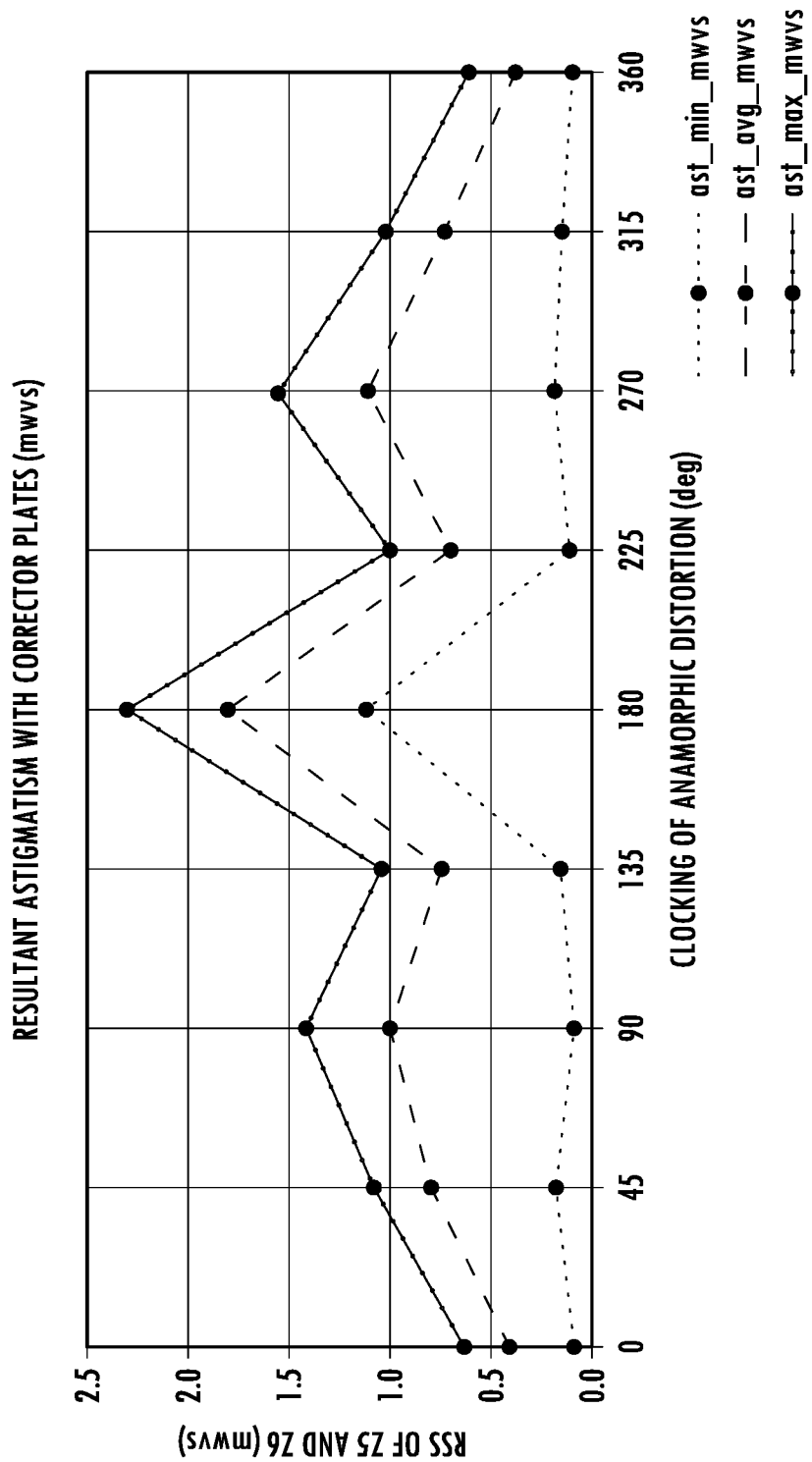
FIG. 8B is a graph illustrating the resultant astigmatism with the rotating corrector plates throughout the anamorphic clocking.

The wavefront aberration without corrector plates 60A and 60B is dominated by astigmatism generated by the cylindrical shaped bent lens plates. The amount of astigmatism produced by the bent cylindrical lens plates increases by the square of the NA and is proportional to the distance from the image plane to the cylinders. The unit mWvs is milli-waves, or ¹⁄₁₀₀₀ of a wave. The comparison of FIGS. 8A and 8B show a significant improvement.

The rotating corrector plates 60A and 60B in the pupil have a hyperbolic paraboloid, or saddle shape on the inner surfaces. For this example, the peak-to-valley (P-V) of the plates is 53 nm. These can be fabricated by deterministic polishing techniques. The P-V is independent of the diameter of the rotating corrector plates, since this is the wavefront correction that is needed in the pupil. The difference in clocking of the two rotating corrector plates generate the magnitude of the correction, and the average of the two generates the clocking of the correction.

Figure 9:
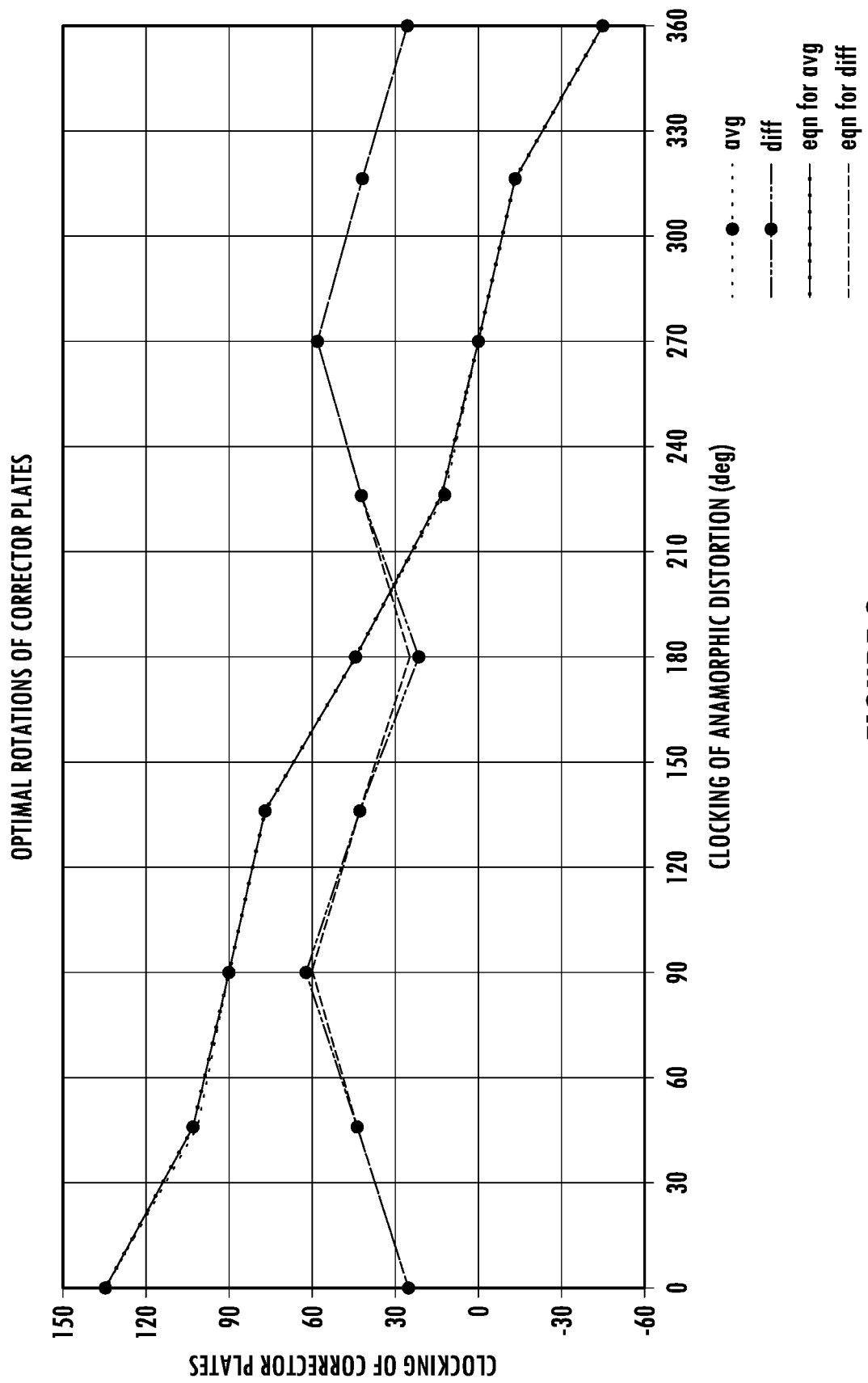
FIG. 9 is a graph illustrating optimal rotations of the rotatable corrector plates throughout the anamorphic clocking.

One example of optimal rotations of the rotating corrector plates is shown in FIG. 9. The precision of the rotations is not demanding to the opto-mechanical design, though the speed could be depending on the diameter of the pupil space. The difference is the angular separation from the nulled clockings of the two rotating corrector plates. The average is the average clockings of the two. The motions may fit to sinusoidal equations.

Figure 10B:
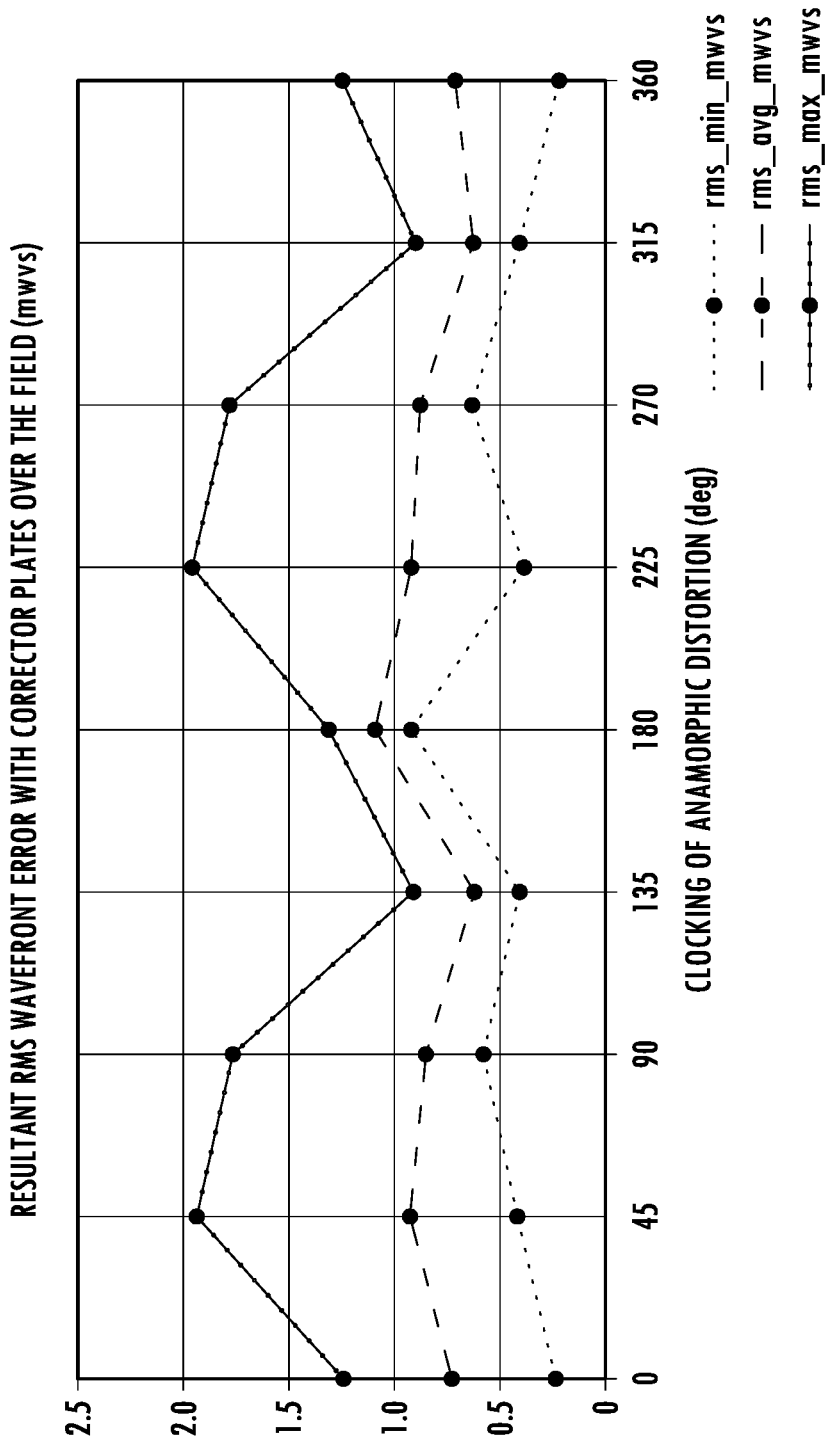
FIG. 10B is a graph illustrating the resultant RMS wavefront error with the rotating correcting plates over the field throughout the anamorphic clocking.

Without the rotating corrector plates 60A and 60B, the wavefront error shown in FIG. 10A is dominated by astigmatism. The residual left from the first and second deformable lens plates 40A and 40B is extremely low when the rotating corrector plates are used as shown in FIG. 10B. These calculated residuals are for the designed deformable lens plates 40A and 40B plus rotating corrector plates 60A and 60B, but does not include any unwanted contributions from the projection lens assembly 16. These are design residuals and do not take into account the errors from fabrication. All residuals are for generating ±100 ppm of anamorphic distortion, and will decrease for cases where less anamorphic distortion is needed.

The projection system 10 advantageously generates anamorphic magnification adjustment for all clockings and a range of magnitudes in a projection system 10 without producing an unacceptable amount of focal plane deviation such as may be experienced with other lens arrangements. The projection system 10 may achieve a full range of anamorphic magnification adjustment with a mechanical motion that is small in distance for the bending plates in the field space and rotations of rotating corrector plates 60A and 60B in the pupil space. This is a results in a simpler, more robust, lower cost, faster full range of travel, and impart a minimal lateral vibration to the imaging system. The projection system 10 may achieve anamorphic magnification adjustment with minimal parasitic aberration effects with the addition of the rotating corrector plates 60A and 60B.

The described embodiments are preferred and/or illustrated, but are not limiting. Various modifications are considered within the purview and scope of the appended claims.

What is claimed is:

1. An anamorphic magnification adjustable projection system comprising:
   an imaging system having an object or image space;
   a first deformable lens plate located within the object or image space for contributing a first magnification power to the imaging system as a function of an amount of curvature of the first deformable lens plate;
   a second deformable lens plate located within the object or image space for contributing a second magnification power to the imaging system as a function of an amount of curvature of the second deformable lens plate;
   a first bending apparatus that adjusts the curvature of the first deformable lens plate through a range of curvature variation for adjusting the first magnification power of the imaging system; and
   a second bending apparatus that adjusts the curvature of the second deformable lens plate through a range of curvature variation for adjusting the second magnification power of the imaging system, wherein the first deformable plate is adjustable about a first transverse axis that extends substantially normal to an optical axis of the imaging system and the second deformable lens plate is adjustable about a second transverse axis that extends substantially normal to the optical axis of the imaging system, wherein the first and second deformable lens plates are oriented such that the first transverse axis is fixed approximately 45 degrees relative to the second transverse axis, wherein bending of the first and second deformable lens plates by the first and second bending apparatuses produces a range of anamorphic magnification adjustment without adjusting the orientation of the first transverse axis relative to the second transverse axis, wherein the first deformable lens plate is larger in size than the second deformable lens plate, and wherein the first deformable lens plate and the second deformable lens plate are configured for bending in different directions while the first transverse axis remains fixed approximately 45 degrees relative to the second transverse axis for producing a range of anamorphic magnification adjustment.

2. The projection system of claim 1, wherein the imaging system further comprises a projection lens assembly and an illuminator for illuminating a beam of light through the projection lens assembly and onto the first and second deformable lens plates.

3. The projection system of claim 2, wherein the projection lens assembly further comprises a first rotating corrector plate located substantially in a pupil of the projection lens assembly and parallel to a second rotating corrector plate, wherein the first and second rotating corrector plates each have a shaped surface and are movable relative to each other to correct for astigmatism induced by the first and second deformable lens plates that create anamorphic distortion.

4. The projection system of claim 3, wherein the first rotating corrector plate has a first shaped surface that rotates relative to a second shaped surface of the second rotating corrector plate.

5. The projection system of claim 4, wherein each of the first and second shaped surfaces is substantially a saddle shape that is defined by the 5th Fringe Zernike term $R^2 \cos(2\theta)$ which is defined in cylindrical coordinates, where R is the distance from an optical axis and $\theta$ is a clocking around a perimeter of the first or second rotating corrector plates.

6. The projection system of claim 4, wherein the first and second rotating corrector plates rotate relative to each other to set a magnitude of the astigmatism correction and rotate together to set an orientation of the astigmatism.

7. The projection system of claim 1, wherein the cylindrical lenses of the first and second deformable lens plates have substantially equal radii.

8. The projection system of claim 1, wherein the first bending apparatus comprises a single actuator for actuating first and second rods on opposite ends of the first lens plate.

9. The projection system of claim 8, wherein the first and second bending apparatuses each comprise a first apparatus arm linked using a substantially single degree of freedom connection to a second apparatus arm.

10. The projection system of claim 9, wherein the first and second bending apparatuses each comprise one or more flexure supports operatively coupled to the first and second rods for allowing changes in a lateral distance for each end of the deformable plate.

11. An anamorphic magnification adjustable projection system comprising:
- an imaging system having an object or image space and a projection lens assembly;
- a first deformable lens plate located within the object or image space for contributing a first anamorphic magnification power to the imaging system as a function of an amount of curvature of the first deformable lens plate;
- a second deformable lens plate located within the object or image space for contributing a second anamorphic magnification power to the imaging system as a function of an amount of curvature of the second deformable lens plate;
- a first bending apparatus that adjusts the curvature of the first deformable lens plate through a range of curvature variation for adjusting the first anamorphic magnification power of the imaging system;
- a second bending apparatus that adjusts the curvature of the second deformable lens plate through a range of curvature variation for adjusting the second anamorphic magnification power of the imaging system, wherein the first deformable plate is adjustable about a first transverse axis that extends substantially normal to an optical axis of the imaging system and the second deformable plate is adjustable about a second transverse axis that extends substantially normal to the optical axis of the imaging system, wherein the first and second deformable lens plates are oriented such that the first transverse axis is approximately 45 degrees relative to the second transverse axis, and wherein bending of the first and second deformable lens plates by the first and second bending apparatuses produces a range of anamorphic magnification adjustment without adjusting the orientation of the first transverse axis relative to the second transverse axis; and
- a first rotating corrector plate located substantially in a pupil of the projection lens assembly and parallel to a second rotating corrector plate, wherein the first and second rotating corrector plates each have a shaped surface and are movable relative to each other to correct for astigmatism induced by the first and second deformable lens plates that create anamorphic distortion, wherein the first deformable lens plate is larger in size than the second deformable lens plate, and wherein the first transverse axis of the first deformable lens plate is fixed relative to the second transverse axis of the second deformable lens plate such that the first transverse axis remains approximately 45 degrees relative to the second transverse axis.

12. The projection system of claim 11, wherein the imaging system further comprises an illuminator for illuminating a beam of light through the projection lens assembly and onto the first and second deformable lens plates.

13. The projection system of claim 12, wherein the projection lens assembly comprises a plurality of lens elements.

14. The projection system of claim 11, wherein the first rotating corrector plate has a first shaped surface that rotates relative to a second shaped surface of the second rotating corrector plate.

15. The projection system of claim 14, wherein the first and second shaped surfaces each is substantially a saddle shape that is defined by the 5th Fringe Zernike term $R^2 \cos(2\theta)$ which is defined in cylindrical coordinates, where R is a distance from an optical axis and $\theta$ is a clocking around a perimeter of the first or second rotating corrector plates.

16. The projection system of claim 14, wherein the first and second rotating corrector plates rotate relative to each other to set a magnitude of the astigmatism correction and rotate together to set an orientation of the astigmatism.

17. The projection system of claim 11, wherein the cylindrical lenses of the first and second deformable lens plates have substantially equal radii.

18. The projection system of claim 11, wherein the first bending apparatus comprises an actuator for actuating first and second rods on opposite ends of the first lens plate.

19. The projection system of claim 18, wherein the first bending apparatus comprises a first apparatus arm is linked using a substantially single degree of freedom connection to a second apparatus arm.

20. The projection system of claim 18, wherein the first bending apparatus comprises one or more flexure supports operatively coupled to the first and second rods for allowing changes in the lateral distance for each end of the deformable plate.

* * * * *